(12) United States Patent
Kulle

(10) Patent No.: US 6,867,680 B1
(45) Date of Patent: Mar. 15, 2005

(54) DUAL MAGNET HALL EFFECT SWITCH

(75) Inventor: Roger K. Kulle, Aurora, IL (US)

(73) Assignee: Otto Controls Division, Otto Engineering, INC, Carpentersville, IL (US)

( * ) Notice: Subject to any disclaimer, the term of this patent is extended or adjusted under 35 U.S.C. 154(b) by 211 days.

(21) Appl. No.: 09/609,578

(22) Filed: Jun. 30, 2000

(51) Int. Cl.$^7$ ................................................ H01C 10/14
(52) U.S. Cl. ..................................... 338/32 H; 338/12
(58) Field of Search .................................. 338/32 H, 12

(56) References Cited

U.S. PATENT DOCUMENTS

| | | | | |
|---|---|---|---|---|
| 3,041,416 A | * | 6/1962 | Kuhrt | ........................ 338/32 H |
| 3,622,922 A | * | 11/1971 | Mogi | ............................ 335/2 |
| 3,848,216 A | * | 11/1974 | Gamble | ..................... 338/32 H |
| 3,858,145 A | * | 12/1974 | Sulich et al. | .............. 338/32 H |
| 3,873,957 A | * | 3/1975 | Wurscher et al. | ......... 338/32 H |
| 3,882,337 A | * | 5/1975 | Pfeffer et al. | ............... 310/273 |
| 4,061,988 A | * | 12/1977 | Lewandowski | ........... 338/32 H |
| 4,425,557 A | * | 1/1984 | Nakamura | ................ 338/32 H |
| 4,471,304 A | * | 9/1984 | Wolf | ..................... 324/207.24 |
| 4,489,303 A | | 12/1984 | Martin | |
| 5,086,861 A | * | 2/1992 | Peterson | ..................... 180/445 |
| 5,365,791 A | * | 11/1994 | Padula et al. | ................. 73/745 |
| 5,477,649 A | | 12/1995 | Bessert | |
| 5,714,728 A | * | 2/1998 | Garneyer et al. | .......... 200/81.5 |
| 6,215,299 B1 | * | 4/2001 | Reynolds et al. | ........ 324/207.2 |

* cited by examiner

Primary Examiner—Karl D. Easthom
(74) Attorney, Agent, or Firm—McAndrews, Held & Malloy, Ltd.

(57) ABSTRACT

A dual magnet Hall effect switch for contactless switching is provided. The Hall effect switch includes a magnet carriage and a Hall effect sensor positioned inside a switch housing. The magnet carriage includes two magnets positioned with opposite polarities facing the Hall effect sensor and in contact. When the switch is actuated, the magnet carriage is displaced within the switch housing and relative to the Hall effect sensor. The two magnets positioned inside the magnet carriage are also displaced. The positional displacement of the magnets relative to the Hall effect sensor alters the magnetic field detected by the Hall effect sensor. When the magnetic field detected by the Hall effect sensor reaches a predetermined level, the switch is actuated. The Hall effect switch also includes a boot seal sealing the switch and an internal clicker ball to provide an audible or tactile indication of the switch's actuation.

14 Claims, 4 Drawing Sheets

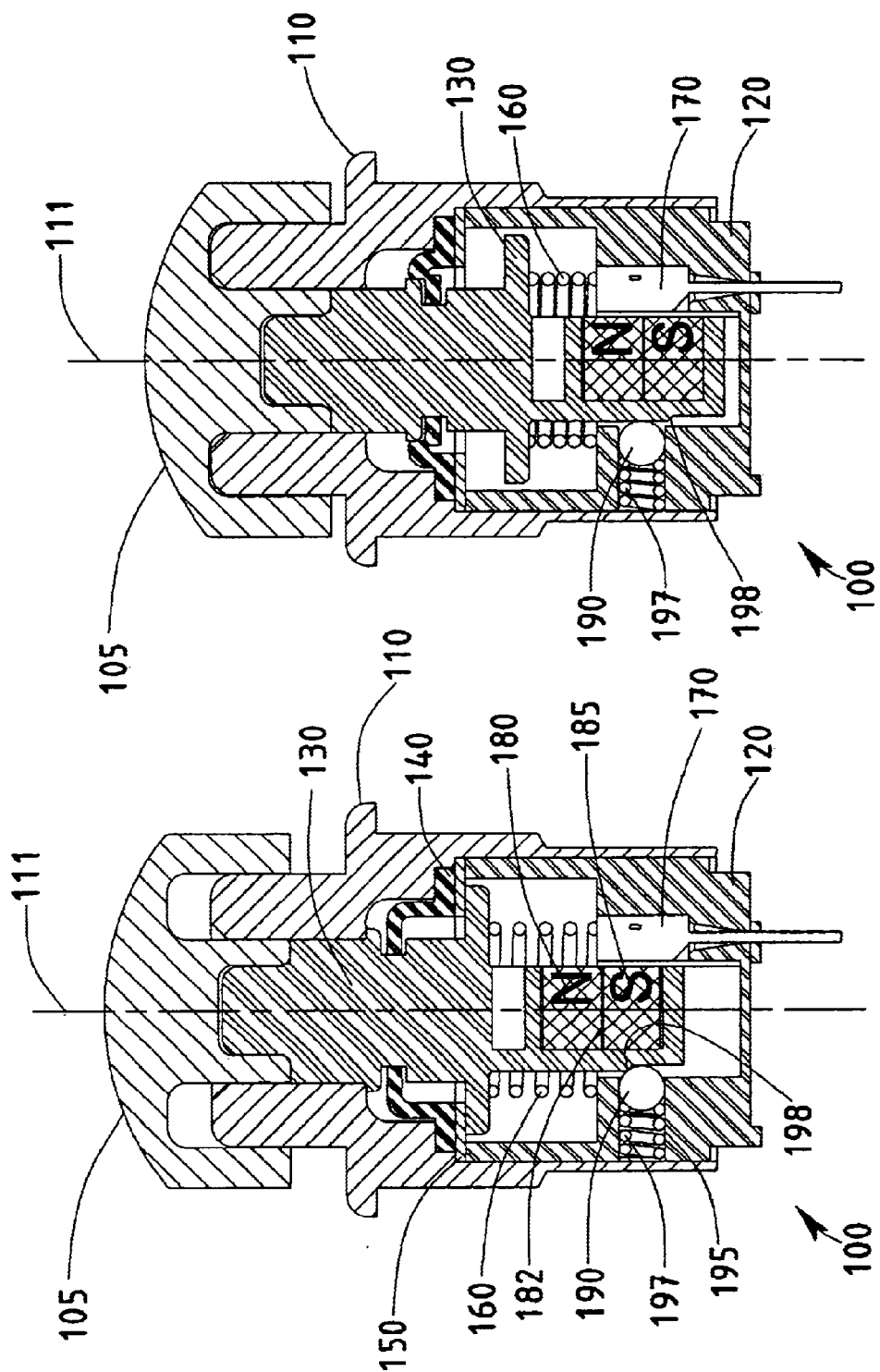

DUAL MAGNET HALL EFFECT SWITCH

BACKGROUND OF THE INVENTION

The present invention generally relates to a dual magnet Hall effect switch. More particularly, the present invention relates to a push button, dual magnet Hall effect switch wherein the two magnets are aligned in parallel, in contact, and have opposite polarities.

The Hall effect occurs when charge carriers moving through a material experience a deflection because of an applied magnetic field. The deflection of the charge carriers results in a measurable electrical potential difference across the material. The potential difference is transverse to the magnetic field and the current direction. A Hall effect transducer measures the applied magnetic field and converts that measurement into a voltage. Hall effect transducers may be packaged to form commercially available Hall effect probes.

Many common applications may rely on the Hall effect and Hall effect probes. For instance, some computer keyboards employ a small magnet and a Hall effect probe to detect when a key is pressed. Some antilock brakes use Hall effect transducers to detect changes in a car wheel's rotational velocity, which can be used to calculate the appropriate braking pressure on each wheels. Additionally, Hall effect probes may be used to measure very small and slow fluctuations in a magnetic field, possibly down to one-hundredth of a gauss.

Hall effect probes may be used in a variety of applications and are particularly well-suited for use in contactless switches. A contactless switch typically includes a Hall effect probe, a magnetic field generator such as a magnet, and a mechanical activation means. In operation, a user activates the mechanical activation means, such as by flipping a switch. The mechanical activation means causes the magnet to move relative to the Hall effect probe. The movement of the magnet relative to the Hall effect probe induces a change in the magnetic field detected by the Hall effect probe. When the magnetic field reaches a predetermined level, the switch is treated as activated. Although the magnet is displaced relative to the Hall effect sensor, the magnet does not contact the sensor, nor does any electrical contact occur. Contactless switches offer improved reliability over conventional switches in which mechanical electrical contacts occur because contactless switches degrade less over time and are thus more reliable. For example, the mechanical contacts in a conventional switch may become corroded with use or alternatively the contacts may no longer form an acceptable electrical connection with use, Hall effect switches may be durable up to millions of actuations.

One useful example of a contactless Hall effect switch is U.S. Pat. No. 4,489,303 issued to Martin (hereinafter the Martin patent). The Martin patent discloses a contactless switch and joystick controller using Hall elements. FIGS. 4 and 5 of the Martin patent show contactless switches employing the Hall effect. Referring to FIG. 4, the contactless switch 60 includes a rod 74 having a magnet 86 mounted on one end, and a push button 80 mounted on the other end. A Hall effect switch 92 is positioned 20 below and in alignment with the rod 74. When the push button 80 on the rod 74 is depressed, the end of rod 74 upon which the magnet 86 is mounted is displaced towards the Hall effect switch 92. The displacement of the magnet 86 towards the Hall effect switch 92 generates a magnetic field at the Hall effect switch 92 which increases as the magnet 86 approaches. When the magnetic field detected at the Hall effect switch 92 reaches a predetermined level, the Hall effect switch 92 is actuated.

FIG. 5 of the Martin patent illustrates an alternate embodiment of a contactless switch 100 employing the Hall effect. The contactless switch includes a rod 74' having a push button 80' mounted on one end, a Hall effect switch 110 and two magnets 106, 108. The two magnets 106, 108 are mounted in the midportion of the rod 74'. Instead of the end-positioned Hall effect switch 60 of FIG. 4. the contactless switch 100 employs a Hall effect switch 110 mounted parallel to the axis of the rod 74' near to the two magnets 106, 108. When the push button 80' is engaged. the rod 74' is displaced downward thus moving the two magnets 106, 108 with respect to the Hall effect switch 110. The movement of the two magnets 106, 108 relative to the Hall effect switch 110 produces a change in the magnetic field detected by the Hall effect switch 110. When the magnetic field detected at the Hall effect switch 110 reaches a predetermined level, the Hall effect switch 110 is actuated.

The two magnets 106, 108 of FIG. 5 are separated by a section of the rod 74'. The separation of the magnets may help to increase the region of linearity of the magnet's magnetic field. A large region of linearity is preferable in many applications because it allows the magnetic field to adjust more slowly with actuation, thus allows a detecting Hall Effect probe to track with greater accuracy.

The invention of the Martin patent is directed toward a video game. In switching applications outside of the video game arena, greater precision switches may be desired. That is, a more precise trigger point for the switch actuation is desired. Also, thermal effects may be encountered in some applications and may alter a switch's magnetic field or the sensitivity of the switch's Hall effect probe.

Thus, a need has long existed for a Hall effect switch having a greater switching precision and increased resistance to thermal effects.

SUMMARY OF THE INVENTION

The present invention provides a dual magnet Hall effect switch for contactless switching. The Hall effect switch includes a an internal housing positioned inside an external housing. Inside the internal housing is a magnet carriage having two magnets, a return spring, a Hall effect sensor and a clicker ball. The two magnets are positioned in contact with each other and with opposite polarities facing the Hall effect sensor. When the switch is actuated, the magnet carriage is displaced relative to the Hall effect sensor. The resulting displacement of the two magnets within the magnet carriages alters the magnetic field detected by the Hall effect sensor. When the magnetic field detected by the Hall effect sensor reaches a certain predetermined level the switch is actuated.

Because the two magnets inside the magnet carriage are positioned in contact and with opposite polarities facing the Hall effect sensor, the change in magnetic field with displacement is relatively large. The switch thus provides a more precise trigger point than conventional switches.

These and other features of the present invention are discussed or apparent in the following detailed description of the preferred embodiments of the invention.

BRIEF DESCRIPTION OF THE DRAWINGS

FIG. 2 illustrates the assembled push button dual magnet Hall effect switch of FIG. 1 in its non-actuated position according to a preferred embodiment of the present invention.

FIG. 3 illustrates the assembled push button dual magnet Hall effect switch of FIGS. 1 and 2 in its actuated position according to a preferred embodiment of the present invention.

DETAILED DESCRIPTION OF THE PREFERRED EMBODIMENTS

In the following detailed description, spatially orienting terms are used such as "left", "right", "vertical", "horizontal", and the like. It is to be understood that these terms are used for convenience of description of the preferred embodiments by reference to the drawings. These terms do not necessarily describe the absolute location in space, such as left, right, upward, downward, etc., that any part must assume.

Figure 1:
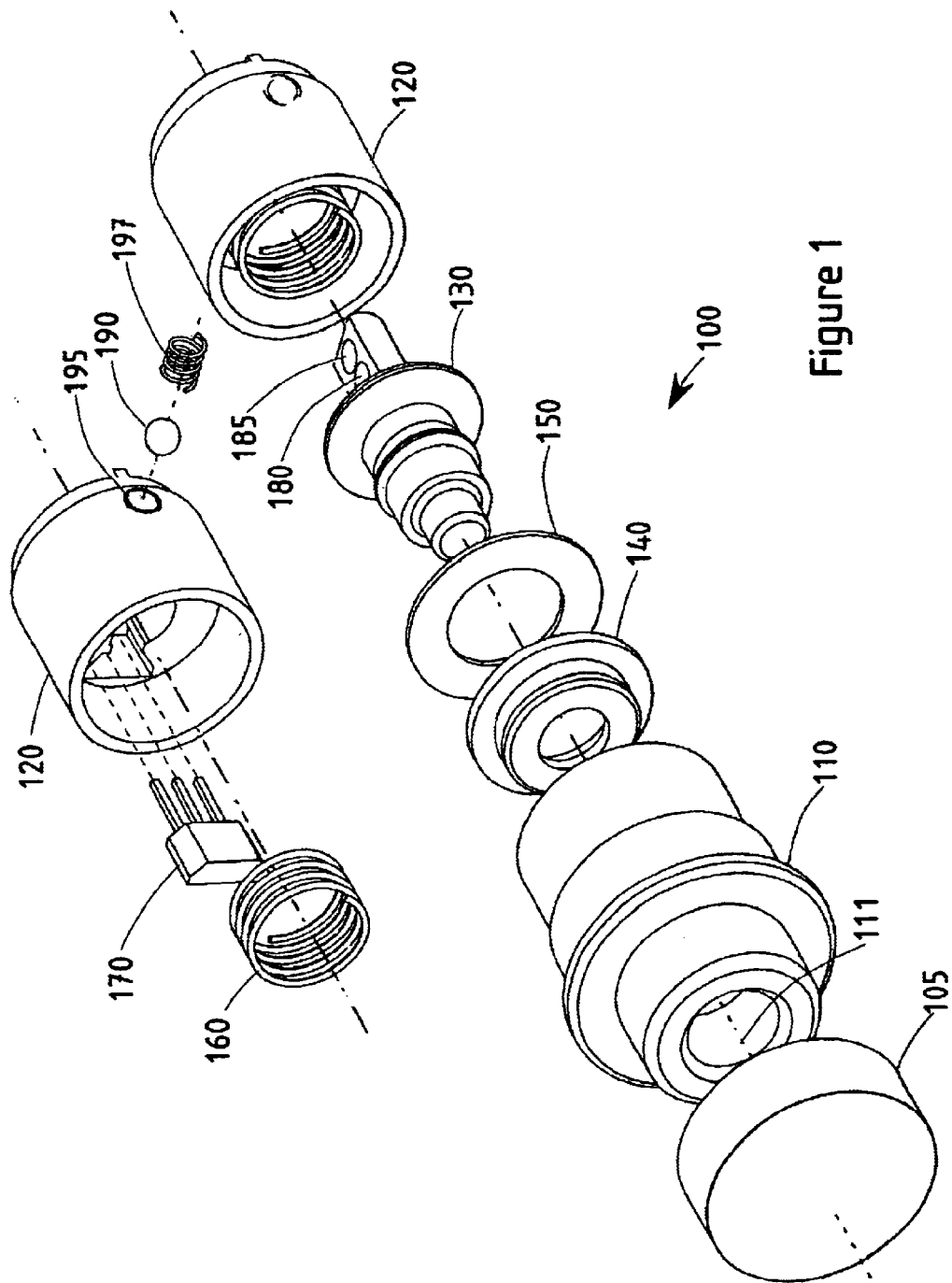
FIG. 1 illustrates the individual components of a push button dual magnet Hall effect switch according to a preferred embodiment of the present invention.

FIG. 1 illustrates the individual components of a push button dual magnet Hall effect switch 100 according to a preferred embodiment of the present invention. The switch 100 includes an end cap 105, exterior housing 110 having an axis 111, an interior housing 120, a magnet carriage 130, a boot seal 140, a seal washer 150, a return spring 160, a Hall effect sensor 170, an first magnet 180, a second magnet 185, a clicker ball 190, a clicker ball aperture 195, and a clicker ball spring 197.

FIG. 2 illustrates the assembled push button dual magnet Hall effect switch 100 of FIG. 1 in its non-actuated position according to a preferred embodiment of the present invention. As seen in FIGS. 1 and 2, the interior housing 120 is positioned axially within the exterior housing 110. The magnet carriage 130 is positioned axially within the interior housing 120. The boot seal 140 is positioned axially between the magnet carriage 130 and the exterior housing 110 and longitudinally between the seal washer 150 and the exterior housing 110. The seal washer 150 is positioned longitudinally between the boot seal 140 and the interior housing 120 and axially between the magnet carriage 130 and the exterior housing 110. The return spring 160 is positioned axially between the magnet carriage 130 and the interior housing 120 and longitudinally between the seal washer 150 and the interior housing 120. The first magnet 180 and the second magnet 185 are positioned along the longitudinal axis of the exterior housing 110 and adjacent to each other and are embedded in the magnet carriage 130. The first magnet 180 and second magnet 185 are in contact with each other. The contact point describes a magnet contact region 182. The Hall effect sensor 170 is positioned radially between the first magnet 180 and second magnet 185 and the interior housing 120. The Hall effect sensor 170 is positioned longitudinally between the magnet carriage 130 and the interior housing 120 so that the midpoint of the Hall effect sensor 170 is generally located at the magnet contact region 182 when the switch 100 is in its actuated position (see FIG. 3). The end cap 105 is positioned on top of the exterior housing 110 and in contact with the magnet carriage 130.

The clicker ball 190 and clicker ball spring 197 are positioned within the clicker ball aperture 195 and are positioned generally radially outwardly from the magnet contact region 182. The clicker ball spring 197 is in contact with the exterior housing 110 and biases the clicker ball 190 into contact with the magnet carriage 130. The magnet carriage 130 includes a clicker nub 198. The clicker ball 190 is biased against the clicker nub 198 on the exterior of the magnet carriage 130.

The exterior housing 110 is preferably constructed of a metallic substance such as aluminum. The end cap 105, interior housing 120, magnet carriage 130, and boot seal 140 are preferably constructed of plastic. The seal washer 150 is preferably constructed of rubber or another elastomeric product. The return spring 160, clicker ball 190, and clicker ball spring 197 are preferably constructed of a metallic substance such as steel.

In FIG. 2, the hall effect switch 100 is shown in its non-actuated position. In operation, a user activates the switch 100 by pressing on the end cap 105 which is in mechanical contact with the magnet carriage 130. The magnet carriage 130 is downwardly displaced within the exterior housing 110 and interior housing 120. The downward displacement of the magnet carriage 130 is against the action of the return spring 160 and causes the return spring 160 to be compressed. The downward displacement of the magnet carriage 130 also causes the magnet contact region 182 to be downwardly displaced relative to the Hall effect sensor 170. The displacement of the magnet contact region 182 relative to the Hall effect sensor 170 causes the magnetic field detected by the Hall effect sensor 170 to change. The change in magnetic field detected bv the Hall effect sensor 170 causes the switch 200 to be actuated.

FIG. 3 illustrates the assembled push button dual magnet Hall effect switch 100 of FIGS. 1 and 2 in its actuated position according to a preferred embodiment of the present invention. As shown in FIG. 3, the downward displacement of the end cap 105 by the user also causes the clicker ball 190 to be moved from its non-actuated position in contact with the clicker nub 198 on the exterior of the magnet carriage 130. As the magnet carriage 130 is downwardly displaced, the clicker ball 190 is forced past the clicker nub 198 to its actuated position as shown in FIG. 3. The movement of the clicker ball 190 produces an audible clicking sound and a tactile sensation to the user to provide an audible or tactile indication that the switch 300 has been actuated.

Once the switch 300 has been actuated, the user releases the end cap 105, thus removing the force that provides the downward displacement of the magnet carriage 130 against the action of the return spring 160. The return spring 170 then expands upwardly and returns the magnet carriage 130 to its non-actuated position as shown in FIG. 2. The upward displacement of the magnet carriage 130 returns the magnet contact region 182 to its non-actuated position.

Preferably, the switch 300 is sealed so that it is air-tight and water-tight. In this respect, the boot seal 140 and seal washer 150 maintain an air and water tight seal for the interior of the switch 100 during activation of the switch 100.

Figure 4:
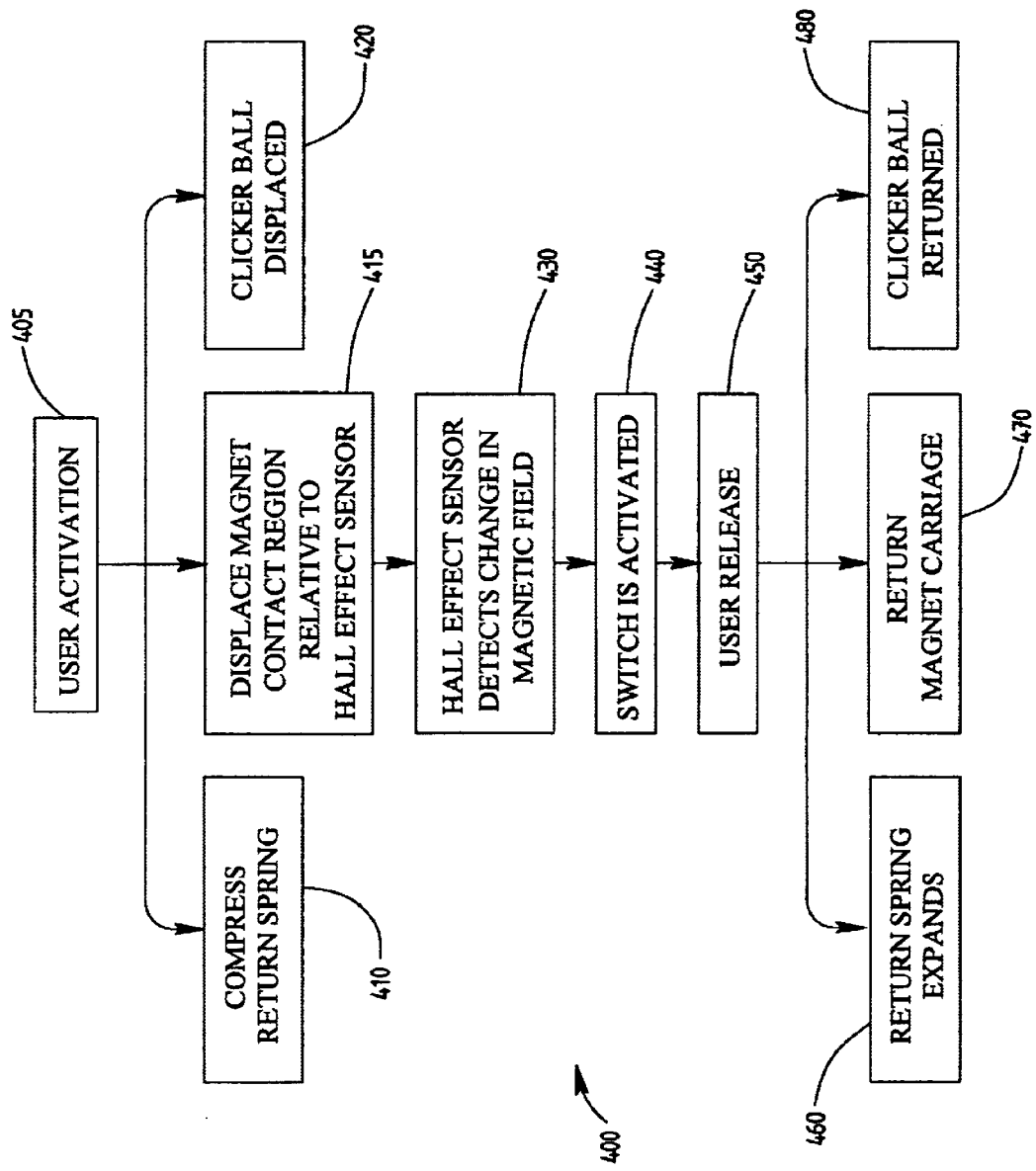
FIG. 4 illustrates a flow chart of a preferred embodiment of the present invention.

The actuation of the switch 100 is summarized in the flowchart 400 of FIG. 4. First, at step 405, the user activates the switch 100. When the user activates the switch 100, steps 410, 415, and 420 occur simultaneously. The magnets contact region 182 is displaced relative to the Hall effect sensor 170 at step 415, the return spring 160 is compressed at step 410, and the clicker ball 190 is displaced from is non-actuated position in contact with the clicker nub 198 as shown in FIG. 2 to its actuated position as shown in FIG. 3, at step 420. Next, the change in magnetic field due to the displacement of the magnets is detected by the Hall effect sensor 170 at step 430. The switch 100 is then actuated at step 440. At step 450, the user releases the switch 100. When the user releases the switch 100, steps 460, 470 and 480 occur simultaneously. At step 460, the return spring 160 expands. The magnet carriage 130 is returned to its non-actuated position at step 470. Finally, at step 480, the clicker ball 190 is returned to its non-actuated position as shown in FIG. 2.

The first magnet 180 and second magnet 185, in addition to being in contact, are preferably cylindrical magnets. The ends of the cylindrical magnets are opposite polarities, commonly called north and south. The first magnet 180 and second magnet 185 are positioned so that the end of the first magnet 180 having a south polarity is positioned adjacent next to the end of the second magnet 185 having a north polarity and vice versa. Because the first magnet 180 and second magnet 185 are positioned with opposite polarities facing the Hall effect sensor 170, the change in magnetic field detected by the Hall effect sensor 170 as the magnets are displaced is large or very well defined. Additionally, because the magnets are in contact, the change in magnetic field as the magnets are displaced is more sharply defined than the change would be if the magnets were separated by some distance. Thus, the positioning and orientation of the magnets according to the present invention yields a precise transition point for switching.

Because the change in polarity of the magnetic field generated by the magnets takes place over a small displacement, only a small displacement is needed to actuate the switch 100. Thus, the switch 100 does not require the extended region of linearity that may be present in the prior art and instead uses a very precise switching point. The switching point is precise because the magnets are in contact and are aligned with opposite polarities so that a small displacement of the magnets produces a large change in magnetic field as detected by the Hall effect sensor 170. As discussed above, the change in magnetic field is detected by the Hall effect sensor 170 and causes the switch 100 to be actuated. The sensitivity of the present invention is such that the switch 100 may be actuated by a displacement of mere thousandths of an inch.

Figure 5:
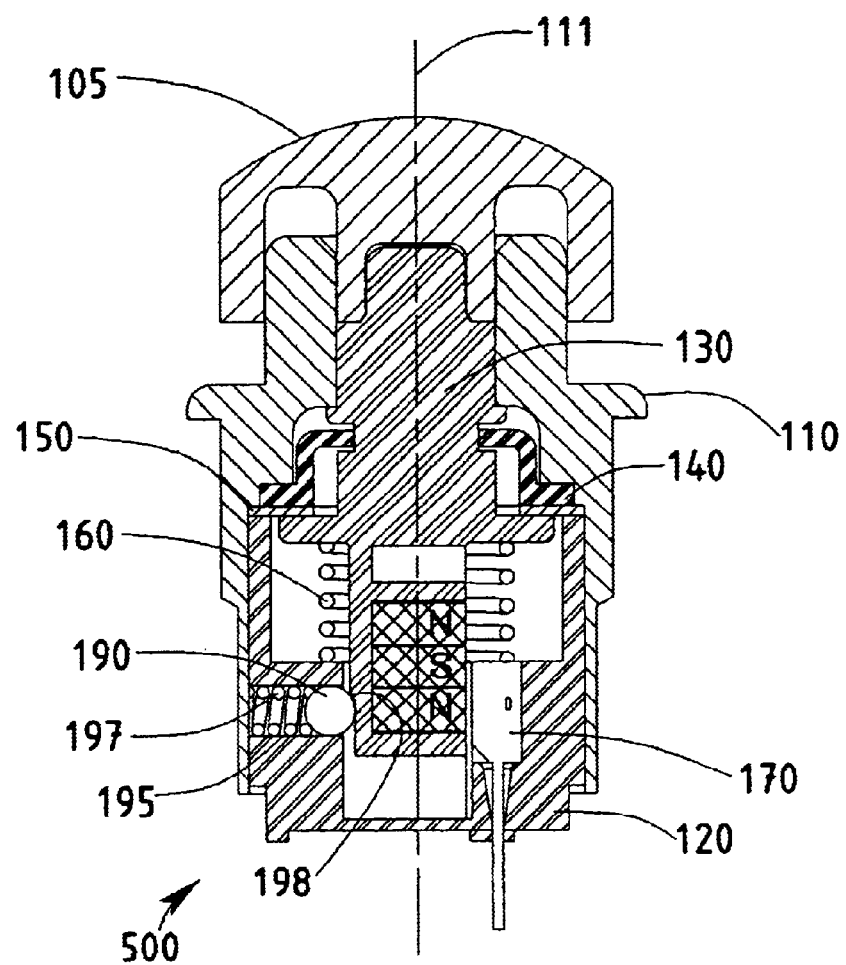
FIG. 5 illustrates a three-magnet Hall effect switch according to a preferred embodiment of the present invention.

Alternatively, the above invention may be implemented using more than two magnets, as shown in FIG. 5. FIG. 5 illustrates a three-magnet Hall effect switch 500 according to a preferred embodiment of the present invention. In FIG. 5, three magnets are inserted in the magnet carriage 130 in place of the first magnet 180 and second magnet 185. The polarities of the magnets may be aligned as north-south-north as shown or alternatively may be north-south-north. This magnet alignment may also yield a fairly large change in magnetic field with displacement. Other variations of magnet number and positioning are also possible.

The Hall effect sensor may be an off-the-self device such as the "3123 Hall effect Switch for High Temperature Operations" commercially available from Allegro Micro System, Inc. While the present invention is described in connection with a push button switch, it will be appreciated by those skilled in the art that the invention is equally applicable to other types of switches such as rocker switches, toggle switches, etc. Other changes, such as providing a detent mechanism, may be made to the switch 100 without departing from the scope of the claimed invention. Additionally, although the preferred embodiment of present invention is described in connection with cylindrical magnets because of ease of manufacturability, the invention is equally applicable to magnets of other shapes.

While particular elements, embodiments and applications of the present invention have been shown and described, it is understood that the invention is not limited thereto since modifications may be made by those skilled in the art, particularly in light of the foregoing teaching. It is therefore contemplated by the appended claims to cover such modifications and incorporate those features which come within the spirit and scope of the invention.

What is claimed is:

1. A Hall effect switch comprising:
   a switch housing;
   a Hall effect sensor positioned inside said switch housing;
   a magnet carriage positioned inside said switch housing, said magnet carriage movable along a first longitudinal axis of the Hall effect switch relative to said Hall effect sensor between a non-actuated position and an actuated position, said magnetic carriage including a first magnet and a second magnet, said first and second magnets facing said Hall effect sensor, being in contact with each other, and each having a respective longitudinal axis that extends generally perpendicular to the first longitudinal axis, said Hall effect sensor responsive to the positional displacement of said first and second magnets relative to said Hall effect sensor such that said Hall effect switch transitions between a non-actuated state when the carriage is at its non-actuated position and an actuated state when the magnetic carriage is at its actuated position; and
   a clicker ball and a clicker ball aperture, said clicker ball being displaced from a non-actuated position to an actuated position by the positional displacement of said magnet carriage and thereby emitting a perceivable clicking indication.

2. The Hall effect switch of claim 1 further comprising a boot seal between said switch housing and said magnet carriage.

3. The Hall effect switch of claim 1 further comprising a return spring for biasing the positional displacement of said magnet carriage.

4. The Hall effect switch of claim 1 wherein said first and second magnets are positioned with opposite polarities facing said Hall effect sensor.

5. The Hall effect switch of claim 1 further comprising at least one additional magnet in said magnet carriage positioned similarly to said first and second magnets.

6. A Hall effect switch comprising:
   a switch housing;
   a Hall effect sensor positioned inside said switch housing;
   a magnet carriage positioned inside said switch housing, said magnet carriage movable relative to said Hall effect sensor and having a first magnet and a second magnet, said first magnet and said second magnet positioned with opposing polarities facing said Hall effect sensor; and
   a clicker ball and a clicker ball aperture, said clicker ball being displaced from a non-actuated position to an actuated position by the positional displacement of said magnet carriage and thereby emitting a perceivable clicking indication;
   said Hall effect sensor responsive to the positional displacement of said first and second magnets relative to said Hall effect sensor.

7. The Hall effect switch of claim 6 further comprising a boot seal between said switch housing and said magnet carriage.

8. The Hall effect switch of claim 6 further comprising a return spring for biasing the positional displacement of said magnet carriage.

9. The Hall effect switch of claim 6 wherein said first and second magnets are positioned in contact with each other.

10. The Hall effect switch of claim 6 further comprising at least one additional magnet in said magnet carriage positioned similarly to said first and second magnets.

11. A method for contactless switching in a switch housing including a Hall effect sensor and a magnet carriage, said method comprising:

mechanically displacing a magnet carriage along a first longitudinal axis of the switch housing, the magnet carriage having a first magnet and a second magnet, said first and second magnets positioned with opposite polarities facing a Hall effect sensor, being in contact with one another, and each having a respective longitudinal axis that extends generally perpendicular to the first longitudinal axis;

detecting the change in magnetic field due to the displacement of the first and second magnets of said magnet carriage with said Hall effect sensor;

actuating said switch based on the change in magnetic field detected by said Hall effect sensor; and generating a perceivable clicking indication bv using a clicker ball and a clicker ball aperture, said clicker ball being displaced from a non-actuated position to an actuated position by the positional displacement of said magnet carriage.

12. The method of claim 11 further comprising sealing said switch housing by using a boot seal between said switch housing and said magnet carriage.

13. The method of claim 11 further comprising biasing the magnet carriage using a return spring.

14. The method of claim 11 further comprises at least one additional magnet in said magnet carriage positions similarly to said first and second magnets.

\* \* \* \* \*